(12) United States Patent
Kaeriyama et al.

(10) Patent No.: US 7,302,026 B2
(45) Date of Patent: Nov. 27, 2007

(54) CLOCK RECOVERY CIRCUIT AND ELECTRONIC DEVICE USING A CLOCK RECOVERY CIRCUIT

(75) Inventors: Shunichi Kaeriyama, Tokyo (JP); Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 789 days.

(21) Appl. No.: 10/653,919

(22) Filed: Sep. 4, 2003

(65) Prior Publication Data

US 2004/0046596 A1 Mar. 11, 2004

(30) Foreign Application Priority Data

Sep. 10, 2002 (JP) ............................. 2002-264587

(51) Int. Cl.
*H04L 7/00* (2006.01)
(52) U.S. Cl. ................. 375/355; 375/371; 375/238; 331/34; 331/57; 331/10; 365/233; 716/1
(58) Field of Classification Search ................. 375/355, 375/371, 238; 331/34, 57, 10; 716/1, 11; 365/233
See application file for complete search history.

(56) References Cited

U.S. PATENT DOCUMENTS

| | | | | |
|---|---|---|---|---|
| 5,075,640 A | * | 12/1991 | Miyazawa | .................... 331/10 |
| 5,237,290 A | | 8/1993 | Banu et al. | |
| 6,184,754 B1 | * | 2/2001 | Kaneko | .................... 331/57 |
| 6,229,402 B1 | * | 5/2001 | Kataoka et al. | .................... 331/34 |
| 6,259,326 B1 | | 7/2001 | Dunlop et al. | |
| 6,337,601 B1 | * | 1/2002 | Klemmer | .................... 331/34 |
| 6,445,252 B1 | * | 9/2002 | Eilken et al. | .................... 331/34 |
| 6,456,128 B1 | | 9/2002 | Nakamura | |
| 6,546,048 B1 | * | 4/2003 | Ichiba et al. | .................... 375/238 |
| 6,754,133 B2 | * | 6/2004 | Morita et al. | .................... 365/233 |
| 7,078,979 B2 | * | 7/2006 | Dally et al. | .................... 331/57 |
| 2002/0056069 A1 | * | 5/2002 | Abe et al. | .................... 716/1 |

FOREIGN PATENT DOCUMENTS

| | | |
|---|---|---|
| JP | 6-53950 | 2/1994 |
| JP | 8-213979 | 8/1996 |
| JP | 9-18525 | 1/1997 |
| JP | 2001-94540 | 4/2001 |
| JP | 2001-320353 | 11/2001 |

\* cited by examiner

*Primary Examiner*—Chieh M. Fan
*Assistant Examiner*—Sudhanshu C. Pathak
(74) *Attorney, Agent, or Firm*—McGinn IP Law Group, PLLC

(57) ABSTRACT

A clock recovery circuit includes a phase discriminating circuit for discriminating, at every edge of a received data signal, phase lead or phase lag of an identically directed edge of the clock signal, and outputting the phase discrimination signal; an edge detecting circuit for detecting edges of the received data signal, outputting an edge detection signal of a fixed pulse width, delaying the received data signal and outputting the delayed signal; an exclusive-OR gate for outputting, as an edge injection signal, an exclusive-OR signal between the phase discrimination signal and delayed signal; and a voltage-controlled oscillator for variably controlling frequency of ring oscillation, injecting the edge injection signal into the loop of ring oscillation, and outputting a clock signal locked to the received data signal.

22 Claims, 11 Drawing Sheets

CLOCK RECOVERY CIRCUIT AND ELECTRONIC DEVICE USING A CLOCK RECOVERY CIRCUIT

FIELD OF THE INVENTION

This invention relates to a clock recovery circuit and, more particularly, to a clock recovery circuit for recovering a clock signal from a received data signal and outputting the clock signal.

BACKGROUND OF THE INVENTION

Clock recovery circuits are used in interfaces for interconnecting logic ICs and boards in many fields such as personal computers, work stations, network devices, computer peripherals, consumer devices and the like.

Examples of configurations of conventional clock recovery circuits, include one which employs a phase-locked loop (referred to as a "PLL" below), one which receives multiphase clock signals to select among multiphase clock signals a signal of which phase is locked to that of a received data signal, and one which uses a gated voltage-controlled oscillator (referred to as a "gated VCO" below).

A clock recovery circuit that uses a PLL comprises a phase comparator, a charge pump, a loop filter and a voltage-controlled oscillator (VCO). The phase comparator compares a phase of a received data signal and a phase of a clock signal which is output from the VCO and fed back to the comparator and the oscillation frequency of the VCO is adjusted by the phase comparator and charge pump so that a phase of the received data signal and a phase of a clock signal output from the VCO are synchronized. As a result, a clock signal locked to the received data signal is recovered. With this technique, the oscillation frequency of the VCO may be the full rate of n [Hz] or the half-rate of n/2 [Hz] with respect to a received data signal having a speed of n [bps].

A clock recovery circuit that selects from multiphase clock signals a clock signal of which a phase is locked to that of a received data signal comprises a multiphase clock generating circuit, a phase comparator, a counter and a selector. The multiphase clock generating circuit generates a plurality of clock signals which have different phases, as well as a frequency that is the full rate of n [Hz] or the half-rate of n/2 [Hz], with respect to a received data signal having a communication speed of n [bps]. The phase comparator compares the phases of a regenerated clock and received data signal and outputs, to the counter, information as to whether the regenerated clock signal leads or lags behind the received data signal. The counter outputs a phase selection signal, which is for advancing or retarding the phase of the regenerated clock signal, depending upon the information from the phase comparator. The selector, which receives the multiphase clock signals output from the multiphase clock generating circuit and the phase selection signal output from the counter, selects a clock signal locked to the received data signal from clock signals output from the multiphase clock generating circuit, and outputs the selected clock signal.

A technique employing the gated VCO is equipped with a VCO that can be switched between an oscillating state and a quiescent state by a gating signal. A clock signal locked to the received data signal is regenerated by controlling the oscillation and quiescence of the VCO in conformity with a change in the received data signal that is supplied to the VCO. This method is advantageous in that a clock signal locked to the received data signal can be recovered by a simple circuit.

By way of example, see the specification of Japanese Patent Kokai Publication JP-A-6-53950 (paragraphs 0022 to 0035 and FIG. 4) and the specification of Japanese Patent Kokai Publication JP-A-8-213979 (paragraphs 0023 to 0029 and FIGS. 1, 2).

SUMMARY OF THE DISCLOSURE

A problem which arises with the technique employing the PLL is that a capacitor used in the loop filter occupies a large area. Such an implementation does not lend itself to a high degree of integration. If communication speed is raised, moreover, a phase comparator and charge pump that operate at high speed become necessary and have the effect of limiting the communication speed.

The technique employing the multiphase clock signal is such that the multiphase clock generating circuit requires a large circuit area. In addition, a high-speed phase comparator is necessary, as in the case the case of the technique using the PLL.

The technique using the gated VCO according to the prior art requires a full-rate oscillator that outputs one cycle of a clock signal for one bit of the received data signal. For example, a full-rate clock signal of n [Hz] is required for a receive data signal having a speed of n [bps]. Consequently, a high-speed VCO is required and a limitation is imposed upon the oscillation frequency of the VCO. Further, this technique cannot be used in a case where it takes time for the oscillation frequency to stabilize when the VCO is switched between the oscillating and quiescent states in order to oscillate and stop the VCO frequently. For these reasons, this technique does not lend itself to a higher speed operation.

Further, this technique is such that a signal that controls the oscillation frequency of the VCO is not subjected to feedback control internally and enters from an external PLL. As a consequence, a problem which arises is an increase in jitter of the recovered clock signal if variances in characteristics between the VCO of the clock recovery circuit and the VCO of the PLL are present.

Furthermore, when the conventional VCO is caused to oscillate at a high frequency, a problem which arises is the occurrence of a shift in the offset voltage of differential signals or a failure to maintain a duty ratio of 50%.

Accordingly, it is an object of the present invention to reduce circuit area and raise communication speed simultaneously in order to create a next-generation high-speed multi-channel communication device.

In accordance with one aspect of the present invention, the above and other objects are attained by a clock recovery circuit for controlling ring oscillation and recovering a clock signal from a received data signal to output the recovered clock signal, wherein an edge portion of a delayed signal obtained by delaying the received data signal has its inversion controlled based upon a phase discrimination signal, which indicates the phase of the clock signal, at every edge of the received data signal and is injected into a loop of the ring oscillation to thereby synchronize the clock signal.

The clock recovery circuit in accordance with another aspect of the present invention comprises a phase discriminating circuit for discriminating, at every edge of the received data signal, phase lead or phase lag of an identically directed edge of the clock signal, and outputting the phase discrimination signal; an edge detecting circuit for detecting edges of the received data signal, outputting an edge detection signal of a fixed pulse width, delaying the received data signal up to half of the fixed pulse width and outputting the delayed signal; an exclusive-OR gate for outputting, as an edge injection signal, an exclusive-OR signal between the phase discrimination signal and delayed signal; and a voltage-controlled oscillator for variably controlling frequency of ring oscillation by a frequency control voltage, injecting the edge injection signal into the loop of ring oscillation in intervals of the fixed pulse width, and synchronizing and outputting the clock signal.

In the present invention, the phase discriminating circuit preferably includes a first D-type flip-flop to which the clock signal is input by a rising-edge trigger of the received data signal; a second D-type flip flop to which an inverted signal of the clock signal is input by a falling-edge trigger of the received data signal; and a selector for selecting an output of either of the first and second D-type flip-flops in accordance with the level of the received data signal and outputting the selected signal as the phase discrimination signal.

In the present invention, the edge detecting circuit preferably includes a first delay circuit for delaying a buffered output of the received data signal up to half of the fixed pulse width and outputting the delayed buffered output as the delayed signal; a second delay circuit for delaying the delayed signal up to half the fixed pulse width; and an exclusive-OR gate for outputting the edge detection signal by computing the exclusive-OR between the output of the second delay circuit and the buffered output.

In the present invention, the voltage-controlled oscillator preferably includes a selector, to which the clock signal and the edge injection signal are input, for selecting and outputting the edge injection signal in conformity with the edge detection signal; and a delay and inverting circuit, which includes a plurality of connected delay elements the delay whereof is controlled by the frequency control voltage, and to which the output of the selector is input, for delaying and inverting this output and outputting the clock signal.

In accordance with another aspect of the present invention, the voltage-controlled oscillator preferably includes a mixer, to which the clock signal and the edge injection signal are input, for mixing these signals at a fixed ratio in accordance with the edge detection signal and outputting the mixed signals; and a delay and inverting circuit, which includes a plurality of connected delay elements the delay whereof is controlled by the frequency control voltage, and to which the output of the mixer is input, for delaying and inverting this output and outputting the clock signal.

The clock recovery circuit in accordance with another aspect of the present invention, further comprises a current-voltage converting circuit for converting a frequency control current to the frequency control voltage and outputting the latter, wherein the frequency control current is supplied upon being converted to a respective frequency control voltage from an output voltage of a low-pass filter which, together with a voltage-controlled oscillator having a structure identical with that of the above-mentioned voltage-controlled oscillator, separately constructs a phase-locked loop.

In the present invention, the edge detecting circuit and exclusive-OR gate preferably comprise logic gates the delays of which can be adjusted by a delay control voltage, wherein the delay control voltage is a delay control voltage of multiple delay elements controlled to have a fixed delay and separately constructing a delay-locked loop or phase-locked loop.

In the present invention, the delay and inverting circuit preferably includes a differential buffer for performing a differential operation as the delay elements using current mode logic and performing an offset correction based upon a differential signal pair of an offset correction signal; a low-pass filter for performing a differential operation using current mode logic, and extracting each DC component of a differential signal pair of the clock signal; and a comparator or amplifier for performing a differential operation using current mode logic, comparing and amplifying a voltage difference between an output pair of DC components of the low-pass filter, and outputting the resulting signals as the differential signal pair of the offset-correction signal.

In the present invention, the differential buffer, to which the differential signal pair of the clock signal and an inverted differential signal pair of the offset correction signal are input in parallel, corrects and outputs each shift in the offset voltages in the differential signal pair of the clock signal by internal addition.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
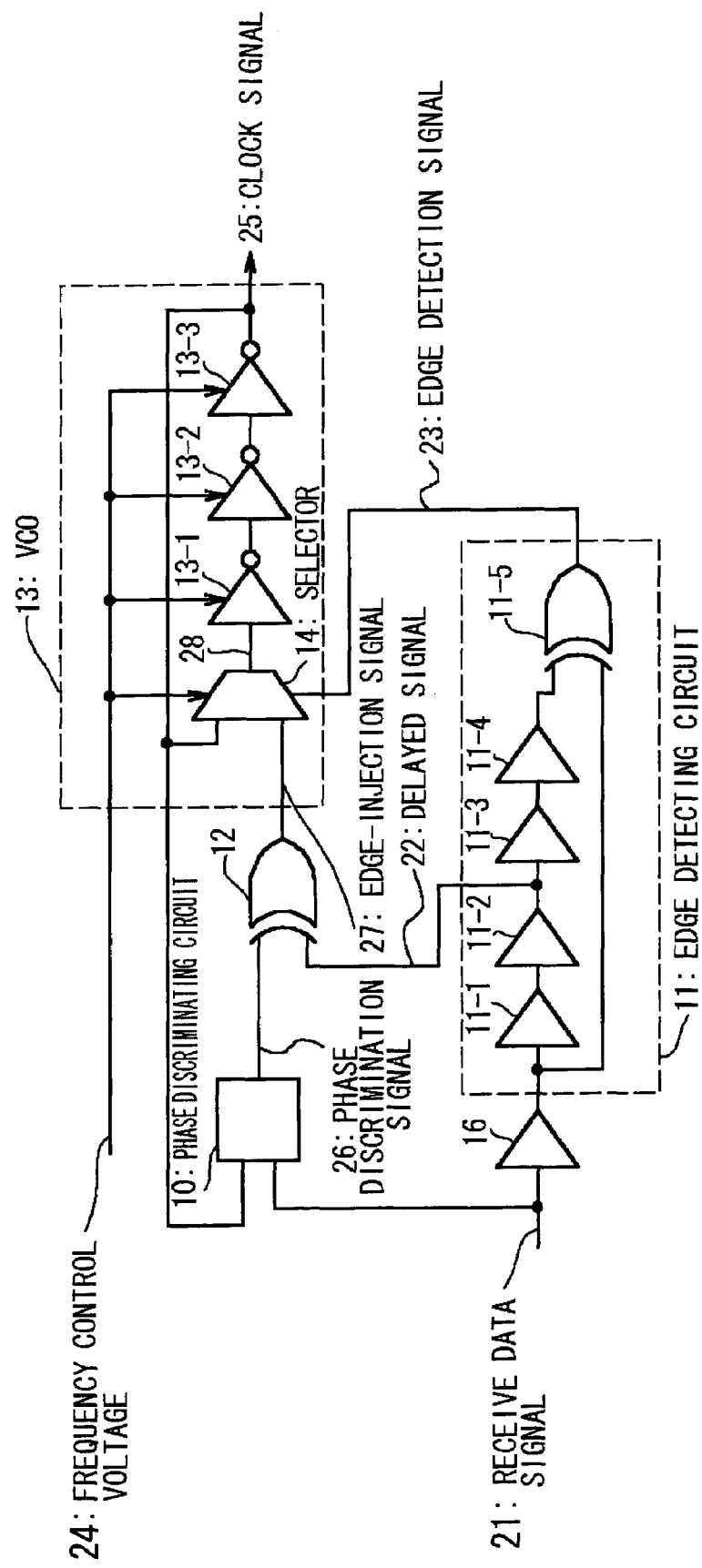
FIG. 1 is a block diagram illustrating a first embodiment of a clock recovery circuit according to the present invention.

Preferred embodiments of the present invention will now be described in detail with reference to the drawings. FIG. 1 is a block diagram illustrating a first embodiment of a clock recovery circuit according to the present invention. As shown in FIG. 1, the clock recovery circuit according to this embodiment comprises a phase discriminating circuit 10, an edge detecting circuit 11, an exclusive-OR gate 12 and a VCO 13.

The phase discriminating circuit 10 discriminates, at every edge of a received data signal 21, phase lead or phase lag of an identically directed edge of a clock signal 25 output from the VCO 13, and outputs a phase discrimination signal 26 indicative of the phase state discriminates.

Figure 2:
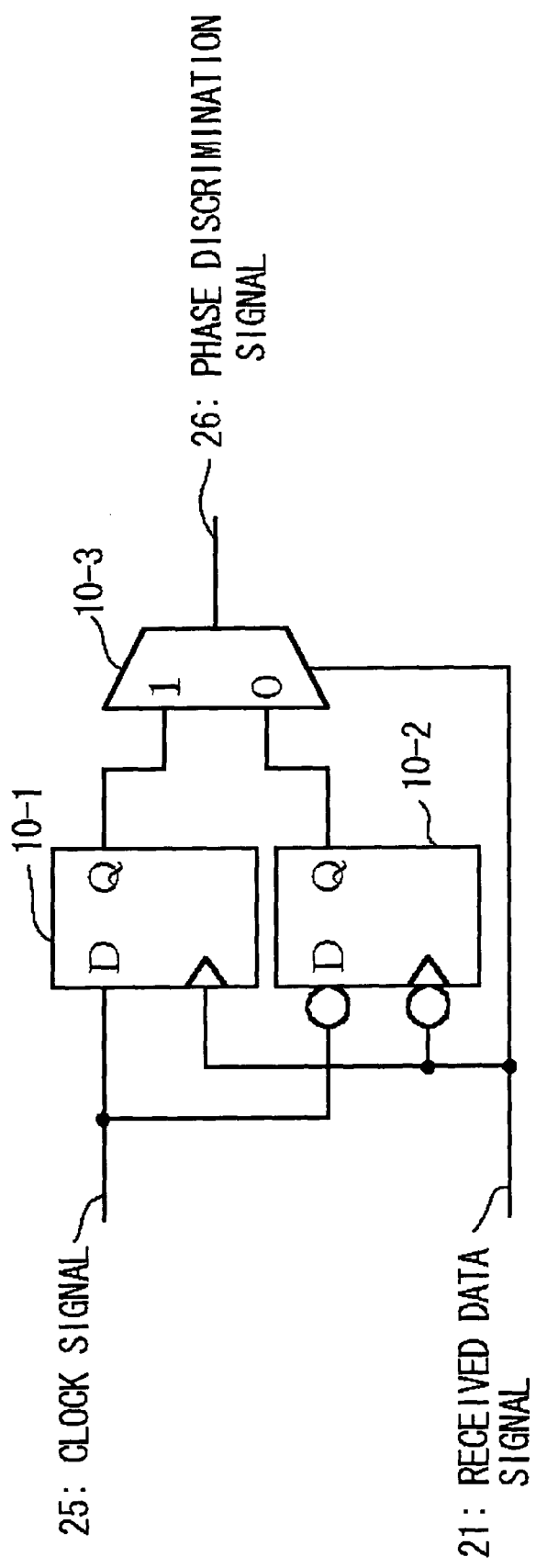
FIG. 2 is a circuit diagram illustrating an example of the structure of a phase discriminating circuit in the clock recovery circuit of the first embodiment shown in FIG. 1.

FIG. 2 is a circuit diagram illustrating an example of the structure of the phase discriminating circuit 10.

As shown in FIG. 2, the phase discriminating circuit 10 includes a D-type flip-flop (FF1) 10-1 which samples the clock signal 25 with a rising-edge of the received data signal 21, a D-type flip flop (FF2) 10-2 which samples an inverted signal of the clock signal 25 with a falling-edge of the received data signal 21; and a selector (SEL1) 10-3 which selects an output of either of the D-type flip-flops 10-1 and 10-2 in accordance with the level of the received data signal 21 and outputting the selected signal as the phase discrimination signal 26. By way of example, in a case where the phase of an edge of the clock signal 25 leads or lags behind the identically directed edge of the received data signal 21, the phase discrimination signal 26 takes on "H" or "L" logic, respectively.

As shown in FIG. 1, the edge detecting circuit 11 includes a first set of delay circuits (11-1 and 11-2) which receives an output signal of a buffer circuit which receives the received data signal 21 for delaying a buffered output signal of the received data signal 21 up to half of a fixed pulse width and outputting the delayed buffered output as a delayed signal 22, a second set of delay circuits 11-3 and 11-4 for delaying the delayed signal 22 up to half the fixed pulse width, and an exclusive-OR gate 11-5 for outputting an edge detection signal 23 by executing a logic exclusive-OR operation between the output of the delay circuit 11-4 and the output signal of the buffer circuit 16. The edge detecting circuit 11 detects the edges of the received data signal 21 and outputs the edge detection signal 23 having a fixed pulse width. The edge detecting circuit 11 outputs the delay signal which is delayed by a half of the fixed pulse width.

The exclusive-OR gate 12 outputs an edge-injection signal 27 which is a result of an exclusive-OR operation between the phase discrimination signal 26 and delayed signal 22.

As shown in FIG. 1, the VCO 13 includes a selector 14 and an inverting delay circuit constituting a ring oscillator. The selector 14, which receives the clock signal 25 and an edge-injection signal 27 as inputs, and receives the edge detection signal 23 as a selection control signal, selects and outputs the edge injection signal 27 in conformity with the edge detection signal 23. The inverting delay circuit(ring oscillator) includes plural stages of inverting delay elements 13-1 to 13-3 arranged in a cascade connection, each delay of which is controlled by a frequency control voltage 24. The propagation delay of the selector 14 is also controlled by the frequency control voltage 24. The output 28 of the selector 14 is supplied to the first stage inverting delay element 13-1 and the clock signal 25 output from the third stage inverting delay element 13-3 is fed back to an input terminal of the selector 14. In the VCO 13, the oscillation frequency of the ring oscillator is varied in accordance with the frequency control voltage 24 and the edge-injection signal 27 is injected via the selector 14 into the loop of ring oscillator in an interval of the fixed pulse width of the edge detection signal 23 for outputting the synchronized clock signal 25. In the present invention, the number of inverting delay elements 13-1 to 13-3 is not limited to 3.

Figure 3:
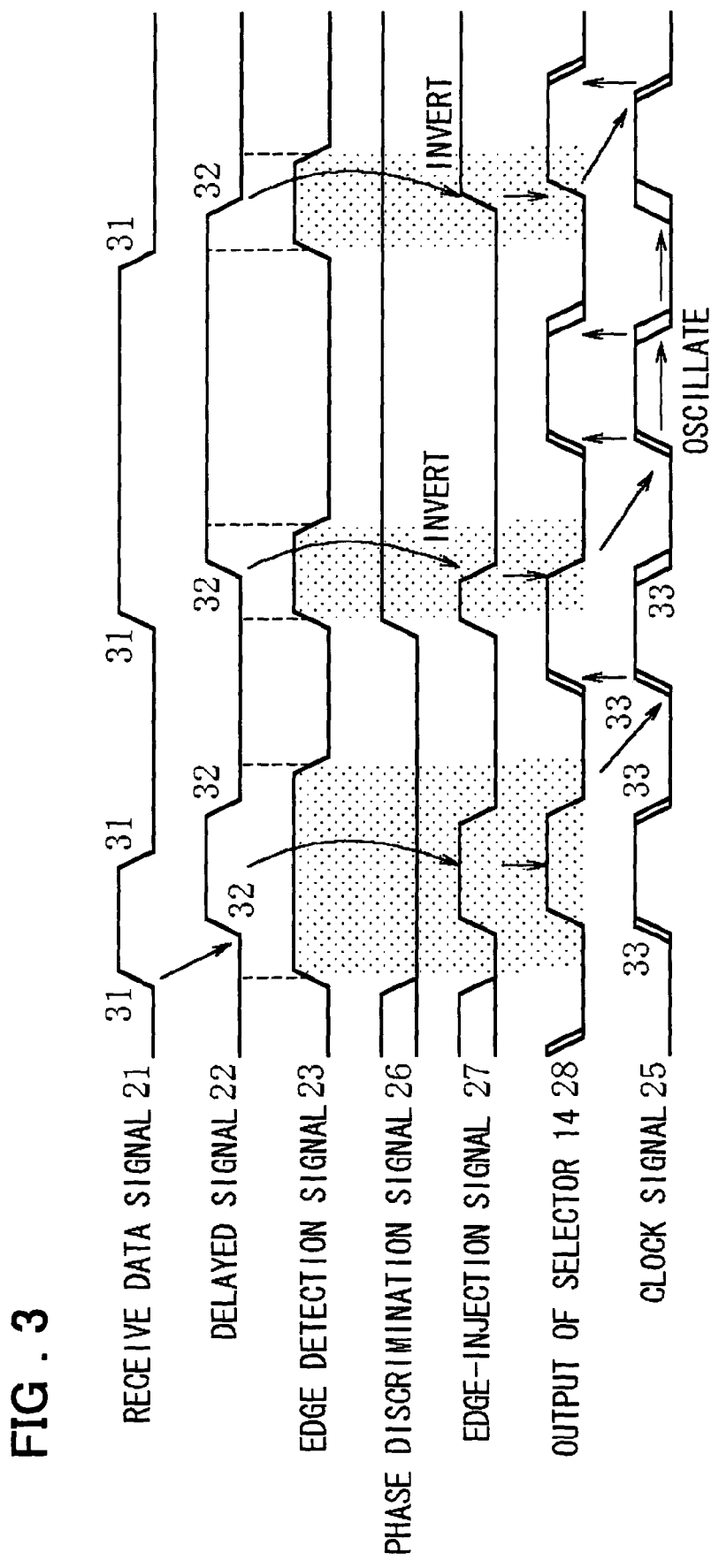
FIG. 3 is a timing diagram illustrating a specific example of operation of the clock recovery circuit of the first embodiment shown in FIG. 1.

FIG. 3 is a timing diagram illustrating an example of operation of the clock recovery circuit according to this embodiment. Reference will now be had to FIG. 3 to describe the operation of the clock recovery circuit of this embodiment.

First, at every edge 31 of the received data signal 21, it is determined by the phase discriminating circuit 10 whether an edge 33 of the clock signal 25 identically directed with the edge 31 of the received data signal 21 leads the edge 31 of the received data signal 21, and the phase discrimination signal 26 from the phase discriminating circuit 10 takes on the "H" or "L" logic level depending upon whether the edge 33 is leading or lagging the edge 31. For example, at first and second rising and falling edges 31 of the received data signal 21 shown in FIG. 3, the identically directed edges 33 of the clock signal 25 are lagging and, hence, the phase discrimination signal 26 takes on the "L" logic level. At third and fourth rising and falling edges 31 of the received data signal 21 shown in FIG. 3, the identically directed edges 33 of the clock signal 25 are leading and, hence, the phase discrimination signal 26 takes on the "H" logic level.

Further, the delayed signal 22 is output upon elapse of a time delay from the received data signal 21, and the edge detection signal 23 takes on the "H" logic level for the duration of a fixed pulse width at every edge 31 of the received data signal 21. The edge 32 of the delayed signal 22 is situated within a period of associated pulse-width of the edge detection signal 23 and the inversion thereof is controlled based upon the phase discrimination signal 26 so as to become an edge of the edge-injection signal 27. The edge of the edge-injection signal 27 is selected by the selector 14 in the pulse-width period of the edge detection signal 23 and is injected into the loop of the ring oscillator, where the edge propagates and become the edge 33 of the clock signal 25. Outside the pulse-width period of the edge detection signal 23, the loop of ring oscillation is formed via the selector 14 and ring oscillation continues at a frequency controlled by the frequency control voltage 24.

More specifically, in the pulse-width period of the edge detection signal 23, rising and falling edges 32 of the delayed signal 22 corresponding to the first and second rising and falling edges 31 of the received data signal 21 shown in FIG. 3 become rising and falling edges, respectively, of the edge injection signal 27. These edges of the edge injection signal 27 are injected into the loop of ring oscillation via the selector 14, propagate through the inverted delay elements 11-1 to 11-3 and become the edges 33 of the clock signal 25.

Further, in the pulse-width period of the edge detection signal 23, rising and falling edges 32 of the delayed signal 22 corresponding to the third and fourth rising and falling edges 31 of the received data signal 21 shown in FIG. 3 are inverted to become the falling and rising edges, respectively, of the edge injection signal 27 by the exclusive OR 12, and these edges are injected into the loop of ring oscillation via the selector 14, propagate through the inverted delay elements 13-1 to 13-3 and become the edges 33 of the clock signal 25. As a result, outside the pulse-width period of the edge detection signal 23, ring oscillation continues at a frequency controlled by the frequency control voltage 24 and even if the clock signal 25 develops a phase shift, a correction can be made at high speed at each of the edges 31 of the received data signal 21.

Thus, as described above, the clock recovery circuit of the present embodiment controls the inversion of the edge portions of the delayed signal 22 of received data signal 21 at every edge of the received data signal 21 based upon the phase discrimination signal 26 of the clock signal 25, injects the edge portion into the loop of ring oscillation and can lock an output clock signal at half the rate of the received data signal 21. A higher speed, therefore, is easier to achieve in comparison with the prior-art technique of using a gated VCO. In particular, it is possible to double the speed in a case where the oscillation frequency of the VCO limits the communication speed.

Further, the clock recovery circuit of the present embodiment does not require a loop filter nor multiphase clock generating circuit and the circuit area can be reduced in comparison with an arrangement that employs a PLL or an arrangement that uses a multiphase clock signal. In particular, whereas the arrangement using the PLL is such that the major part of the area thereof is occupied by a loop filter, the clock recovery circuit of the present embodiment is capable of reducing the area to a fraction of that required in the arrangement that uses the PLL.

A second embodiment of a regenerator according to the present invention will now be described.

In comparison with the clock recovery circuit of the first embodiment shown in FIG. 1, the clock recovery circuit according to the second embodiment is such that the blocks other than the VCO 13 are the same structurally but the internal structure of the VCO 13 is different. Accordingly, in the description of the clock recovery circuit of this embodiment, only the VCO 13 and its related parts will be described in order to avoid prolixity.

Figure 4:
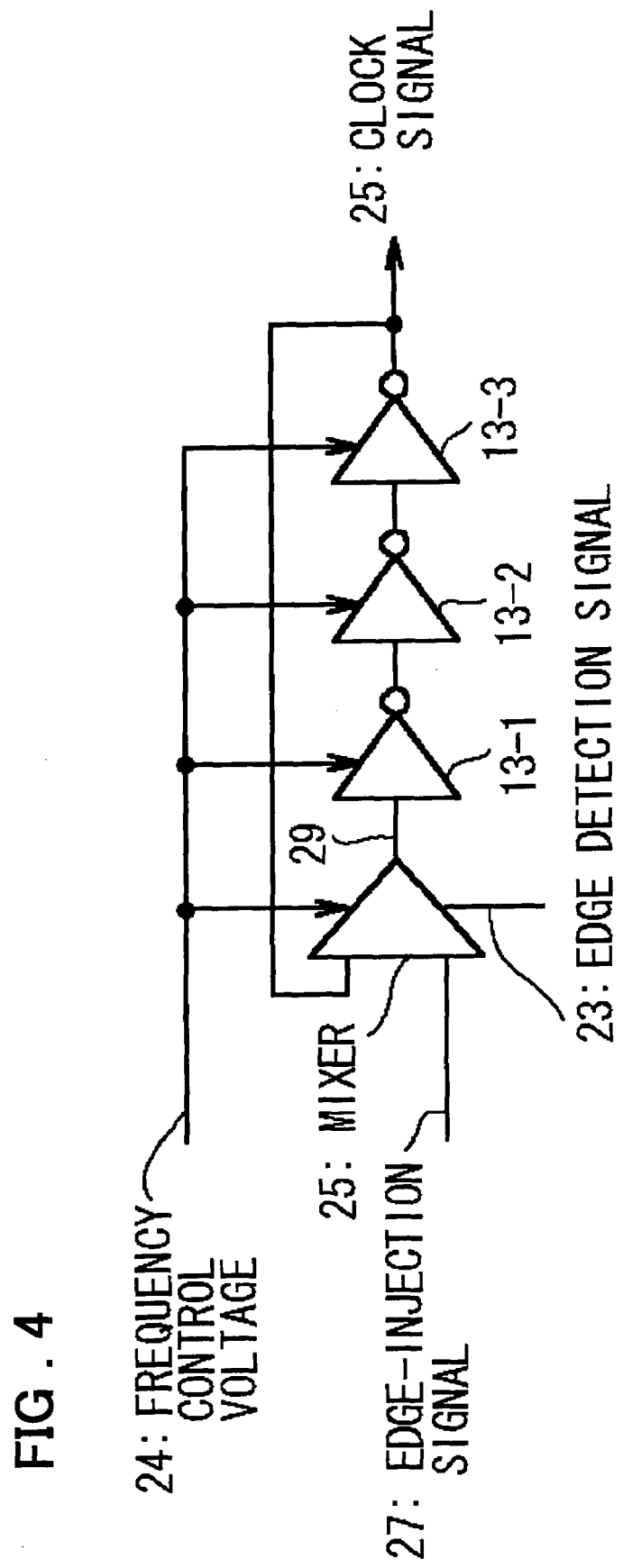
FIG. 4 is a circuit diagram illustrating an example of the structure of a VCO according to a second embodiment of a clock recovery circuit of the present invention.

FIG. 4 is a circuit diagram illustrating an example of the structure of the VCO 13 in the clock recovery circuit of this embodiment.

Referring to FIG. 4, the VCO 13 in the clock recovery circuit of the second embodiment includes a mixer 15, which receives the clock signal 25 and the edge injection signal 27 as inputs, for mixing input signals at a fixed ratio in accordance with the edge detection signal 23 and outputting the mixed signals, and an inverting delay circuit, which includes plural stages of inverting delay elements 13-1 to 13-3 connected in series, the delay whereof is controlled by the frequency control voltage 24. The output of the mixer 15 is supplied to the first inverting delay element 13-1 and third inverting delay element 13-3 outputs the clock signal 25. The frequency of ring oscillation is variably controlled by the frequency control voltage 24, and the edge injection signal 27 is mixed and injected into the loop of ring oscillation at a fixed ratio in the fixed pulse-width period of the edge detection signal 23. It should be noted that the synchronization characteristic of the clock signal 25 can be changed by changing the ratio of mixing performed by the mixer 15.

Figure 5:
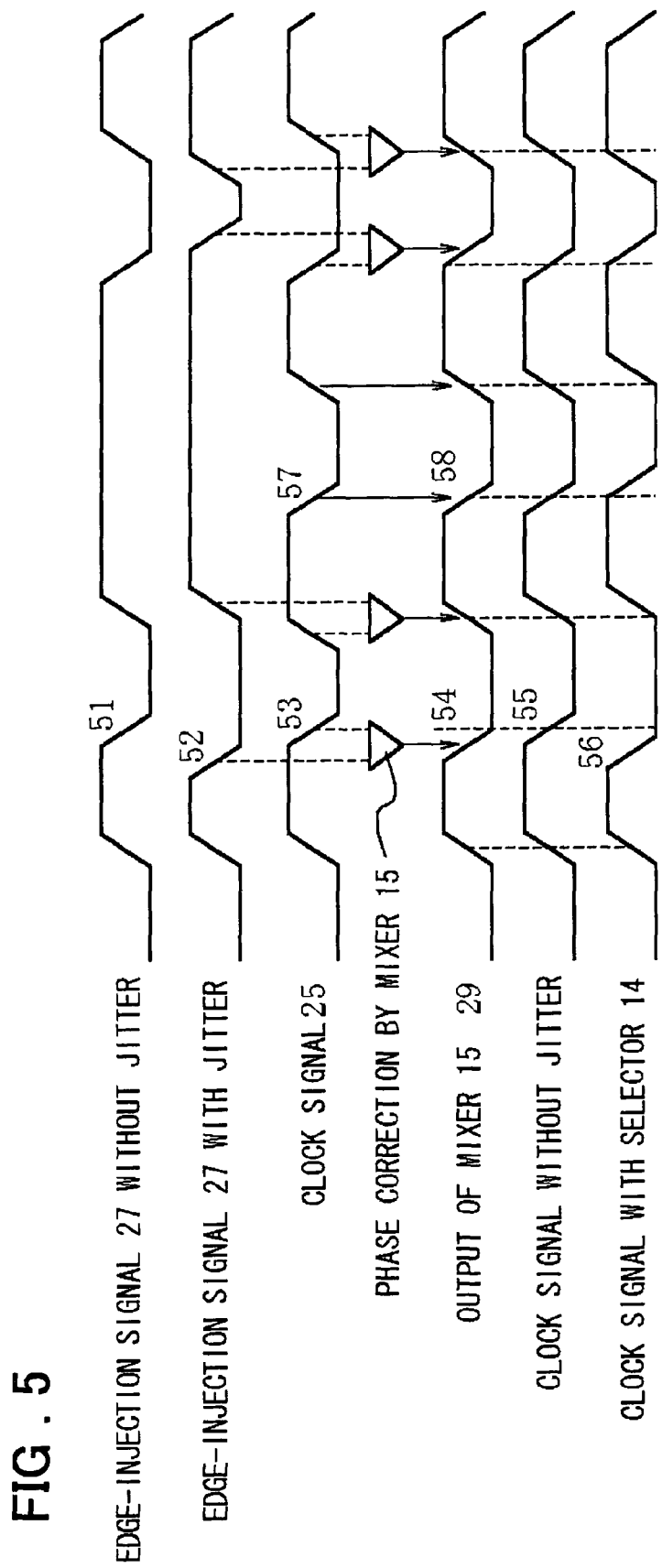
FIG. 5 is a timing diagram illustrating a specific example of operation of the VCO in the clock recovery circuit of the second embodiment shown in FIG. 4.

FIG. 5 is a timing diagram illustrating an example of operation of the VCO 13 in the clock recovery circuit according to the present embodiment. Reference will now be had to FIG. 5 to describe the operation of the VCO 13 in the clock recovery circuit of this embodiment.

First, if a data signal exhibiting jitter is received, an edge 52 of the edge injection signal 27 corresponding to the received data signal will shift relative to an edge 51 of the edge injection signal 27 corresponding to an ideal received data signal that is free of jitter.

In the pulse-width period of the edge detection signal 23 (i.e., when the edge detection signal is at the high level), the edge 54 of the output 29 of mixer 15 has a phase that is intermediate the edge 52 of the edge injection signal 27 exhibiting jitter and the edge 53 of the clock signal 25 fed back to the mixer. A phase correction is applied so that the phase shift relative to the ideal phase that prevails when jitter is absent is reduced in comparison with the output 28 of selector 14 in the VCO 13. The edge propagates further and becomes the edge of the clock signal 25, and ring oscillation is achieved at a frequency controlled by the frequency control voltage 24. As a result, the clock signal 25 of the VCO 13 using the mixer 15 has less jitter than the clock signal 25 of the VCO 13 using the selector 14 shown in FIG. 1.

Outside the pulse-width period of the edge detection signal 23 (when the edge detection signal is at the low level), the mixer 15 outputs only the clock signal 25, the edge 57 of the clock signal 25 is propagated as is to the output 29 of mixer 15, the edge 58 is output and this propagates further to become the edge of the clock signal 25. The ring oscillates at a frequency controlled by the frequency control voltage 24.

Thus, as described above, the clock recovery circuit of this embodiment is such that if data exhibiting jitter is received, the operation of the mixer 15 in the VCO 13 makes it possible to greatly reduce clock-signal jitter, which is ascribable to jitter of the received data signal, in comparison with the VCO 13 using the selector 14 of FIG. 1.

First to third modifications of the clock recovery circuit according to the first or second embodiment set forth above will be described with reference to the drawings in regard to an electronic device that uses the clock recovery circuit of the present invention.

Figure 6:
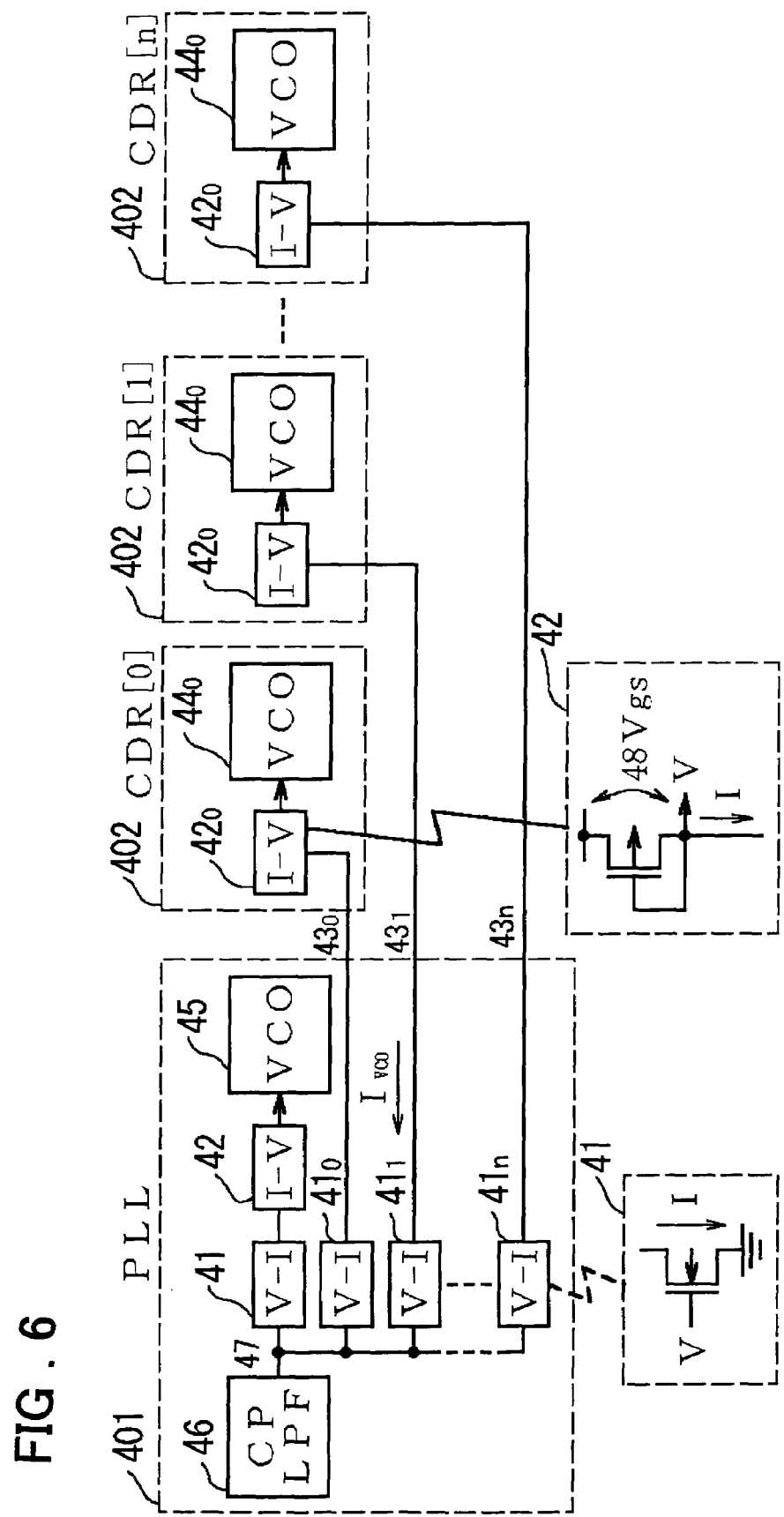
FIG. 6 is a block diagram illustrating a first modification, and an example of connection thereof, of the clock recovery circuit according to the first or second embodiment.

FIG. 6 is a block diagram illustrating a first modification, and an example of connection thereof, of the clock recovery circuit according to the first or second embodiment. FIG. 6 illustrates an example of a connection between a plurality (n pieces) of clock recovery circuits CDR[1] to CDR[n] of the embodiment and a PLL.

In the PLL connected to the clock recovery circuits CDR[1] to CDR[n] of this embodiment, a VCO 45 oscillates at a desired frequency owing to a frequency control voltage 47 that is output from an internal charge pump and loop filter 46. A charge pump and loop filter 46 receives a phase comparison result from a phase detector (not shown) and generates frequency control voltage 47 corresponding to the phase comparison result which has been smoothed by a loop filter. In the PLL, the phase detector (not shown) compares a phase of the clock signal output from the VCO 45 with that of the received data signal or a reference clock signal (not shown) supplied from outside to the PLL. In case where the phase of the clock signal is compared with that the reference clock signal, the clock signal output from the VCO 45 is typically frequency-divided by a frequency divider (not shown) and the phase detector compares the phase of the frequency-divided clock signal with that of the reference clock signal. The frequency control voltage 47 is supplied to n number of voltage to current converting circuits (V-I) 41. The output of voltage to current converting circuits (V-I) 41 is supplied to a current to voltage converting circuit (I-V) 42 and the output voltage from the current to voltage converting circuit (I-V) 42 is supplied to the VCO 45.

Frequency control currents (Ivco) 43 output from N number of current converting circuit (V-I) 41 are supplied to voltage converting circuits (I-V) 42 of the clock recovery circuits CDR[1] to CDR[n] respectively. In each of the clock recovery circuits CDR[1] to CDR[n], a frequency control voltage by a current-voltage converting circuit (I-V) 42 is supplied to a VCO 44. The voltage to current converting circuit (V-I) 41 is composed of a n-channel MOS transistor which has a source connected to the ground, a gate for receiving a signal 47 and a drain from which an output current is obtained. The current to voltage converting circuit (I-V) 42 is composed of p-channel MOS transistor, which has a source connected to a power supply voltage terminal, and has a gate connected to a drain to which an input current is supplied and from an output voltage V is obtained.

By using this technique of supplying the frequency control current (Ivco) 43, the influence of any variation in power-supply voltage in each VCO 44 can be alleviated by an output voltage (Vgs) 48 from the current to voltage converting circuit (I-V) 42.

Further, even if the characteristics of transistors within the chip vary, the influence upon the VCO oscillation frequency can be reduced. This will be described next with reference to FIG. 7.

Figure 7:
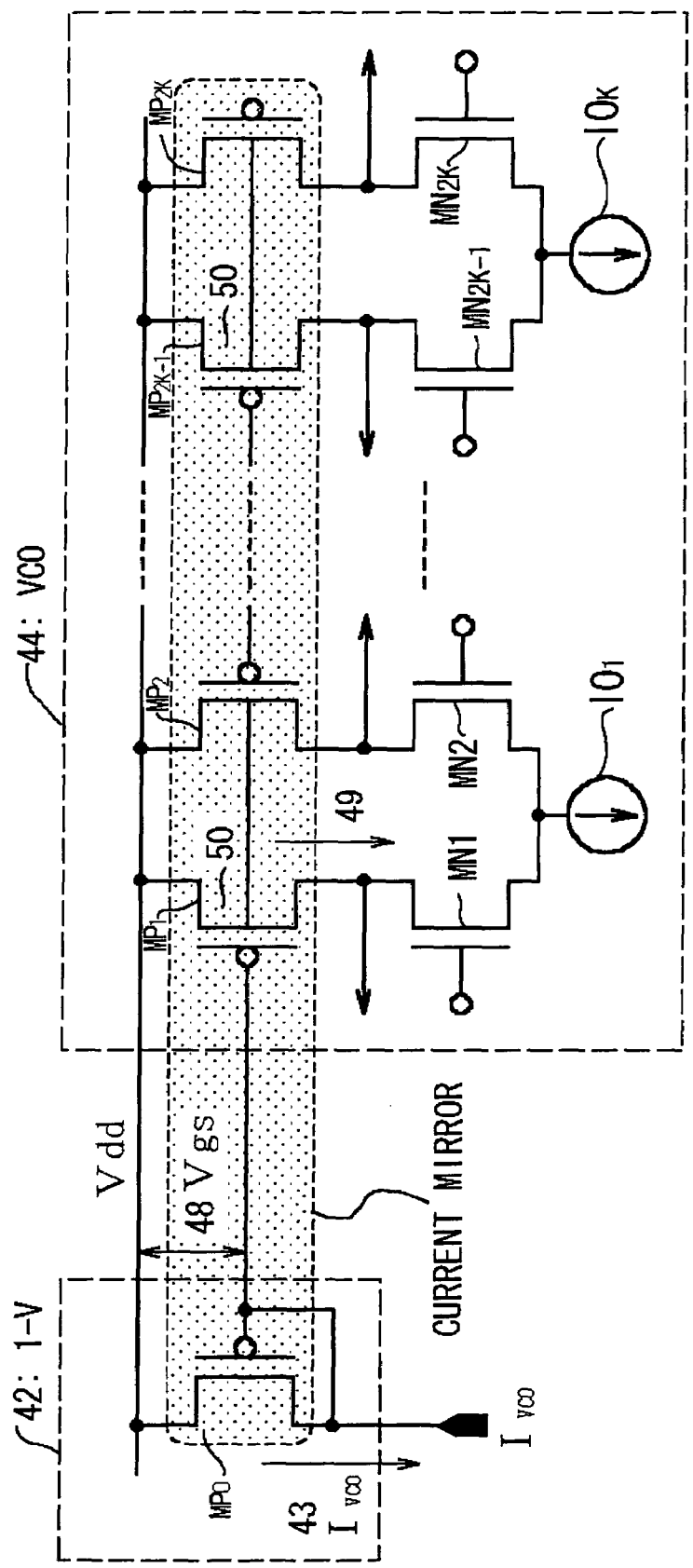
FIG. 7 is a partial circuit diagram illustrating a current-voltage converting circuit, as well as part of the circuit of a VCO comprising current mode logic (CML), in the clock recovery circuit of the first modification shown in FIG. 6.

FIG. 7 is a partial circuit diagram illustrating the current-voltage converting circuit (I-V) 42, as well as part of the circuit of the VCO 44 comprising current mode logic (CML), in the clock recovery circuit of the first modification shown in FIG. 6. The VCO 44 is comprised of plural number of differential circuits (inverters), each of which includes a differential pair, a constant current source 10, and active loads. The gate and drain of the p-channel MOS transistor MP0 of the current-voltage converting circuit (I-V) 42 are connected in common and connected to the gates of p-channel MOS transistors MP1 to MP2k+1 of the active loads of differential circuits in the VCO and the p-channel MOS transistor MP0 and MP1 to MP2k+1 compose a current mirror circuit with multiple outputs. Each differential circuit constituting a delay element in the VCO 44, has inverting and non-inverting outputs and hence the ring oscillator in the VCO44 may be configured by even number of differential circuits. That is, the number k which designates the number of stages of the differential circuits in FIG. 7 is allowed to be even number. On the other hand, as is well known, in case where a delay element of a ring oscillator is to be constituted by a CMOS inverter, the ring oscillator is configured by odd number of CMOS inverters.

The frequency control current (Ivco) 43 is converted to the frequency control voltage by the current to voltage converting circuit (I-V) 42, and the frequency control voltage is supplied to the VCO 44 as a potential difference (Vgs: gate-to-source voltage) 48 with respect to power-supply voltage Vdd. Propagation delay of the delay elements that compose the VCO 44 is controlled by a current 49 that flows into a pMOS load 50. Though the current 49 is decided by the potential difference (Vgs) 48, the current 49 becomes equal to the frequency control current (Ivco) 43 because the current 49 is a mirror current of the frequency control current (Ivco) 43.

Consequently, even if the power-supply voltage Vdd of the VCO 44 differs from the power-supply voltage of the PLL or other VCOs 44, the current 49 that flows into the delay elements of the VCO 44 becomes equal to the frequency control current (Ivco) 43 and, as a result, the oscillation frequency of the VCO 44 is not readily affected by variation of the power-supply voltage. Further, even if the transistor characteristics of the VCO 44 differ from the power-supply voltage of the PLL or other VCOs 44, the current 49 that flows into the delay elements of the VCO 44 will become equal to the frequency control current (Ivco) 43 owing to the current mirror so long as the transistor characteristics of the current-voltage converting circuit (I-V) 42 and the characteristics of the pMOS transistors of the delay elements agree. This means that the oscillation frequency of the VCO 44 will not readily be affected by a disparity in the transistor characteristics between VCOs 44.

Figure 8:
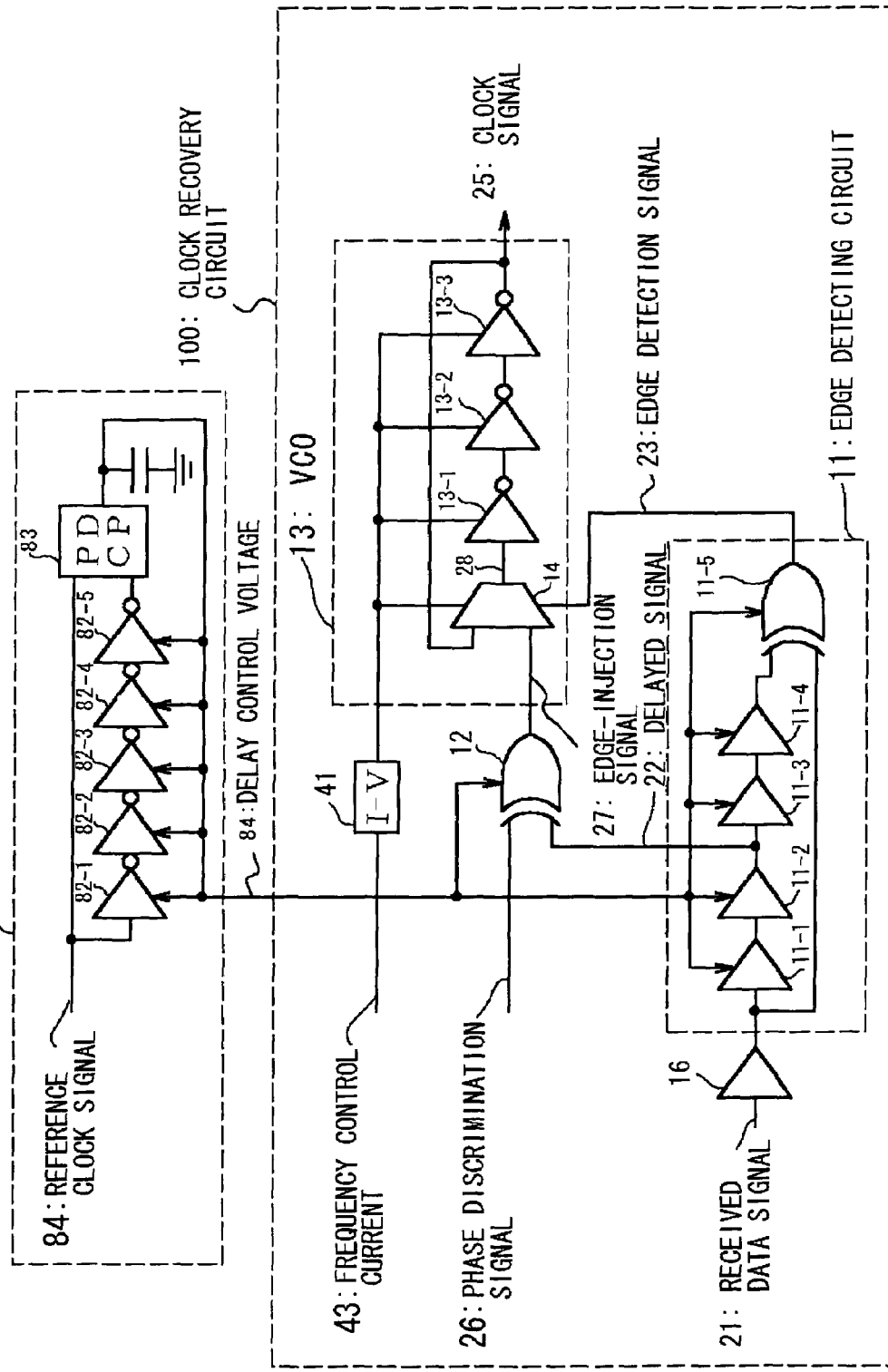
FIG. 8 is a block diagram illustrating a second modification, and an example of connection thereof, of the clock recovery circuit according to the first or second embodiment.

FIG. 8 is a block diagram illustrating a second modification, and an example of connection thereof, of the clock recovery circuit according to the first or second embodiment. The clock recovery circuit of this modification exhibits a structure that is not readily susceptible to the effects of process variation and power-supply variation.

The clock recovery circuit according to this modification is such that each of the constituent gates is provided with a delay adjusting function, and a fluctuation in the delay of the gates is compensated for using a delay control voltage generated by a delay-locked loop (referred to as a "DLL" below) and PLL. A DLL 81 comprises five delay elements 82-1 to 82-5, the delay of which can be adjusted by an externally applied signal, a phase comparator (PD) and charge pump (CP) 83, in which the phase comparator (PD) compares phases of the reference clock and an output of the delay element 82-5 and the charge pump (CP) executes charging a capacitor 85 based on the comparison result by the phase comparator (PD). The terminal voltage of the capacitor 85 is used as a delay control voltage 84 supplied to five delay elements 82-1 to 82-5. By controlling feedback of the delay control voltage 84 in such a manner that the delay of the five delay elements 82-1 to 82-5 becomes a half cycle of the clock, the delay can be adjusted so as to be constant.

For example, if a reference clock signal is 5 [GHz], then a half cycle of the clock signal is 100 [ps] and the delay control voltage 84 is adjusted automatically in such a manner that the delay of one delay element 82 will become 20 [ps].

The clock recovery circuit 100 includes a current to voltage converting circuit (I-V) 41, a voltage controlled oscillator (VCO) 13, an exclusive OR 12, a buffer circuit 16 and an edge detecting circuit 11.

The current to voltage converting circuit (I-V) 41 which converts a frequency control current 43 to a voltage which is fed to a selector 14, inverting delay circuits 13-1 to 13-3 as a frequency control voltage. The exclusive OR 12, the propagation delay of which is controlled by the delay control voltage 84, receives a phase discrimination signal and a delayed signal 22 and outputs an edge-injection signal. The VCO 13 and the edge detecting circuit are the same as those described in FIG. 1.

By supplying the delay control voltage 84 to the logic elements(i.e., an exclusive OR 12 and delay elements 11-1 to 11-4) that constitute the clock recovery circuit 100, the delay per logic element can be held at 20 [ps] irrespective of temperature or process variation.

It is assumed that the logic gates that construct the clock recovery circuit have such a structure that delay can be adjusted by an externally applied signal.

Figure 9:
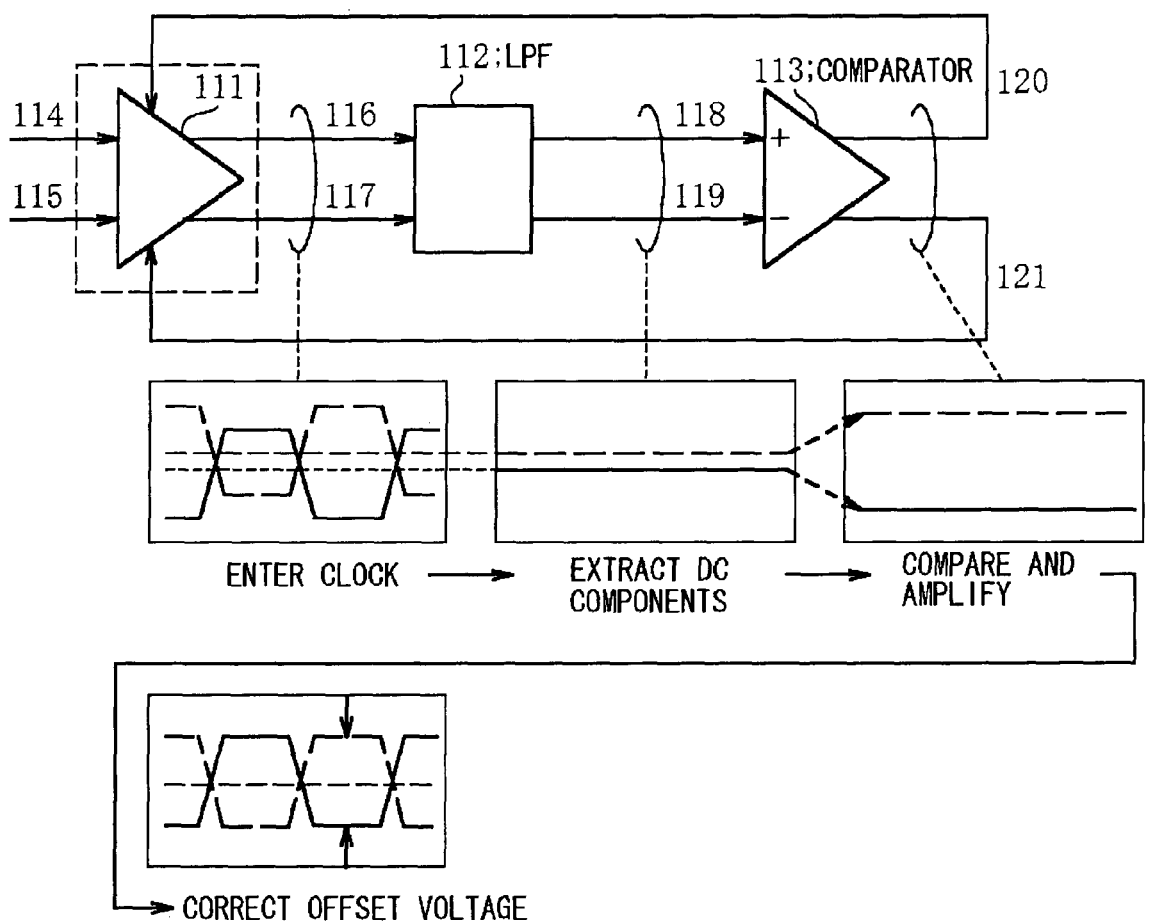
FIG. 9 is a partial circuit diagram illustrating part of a VCO in a third modification of the clock recovery circuit according to the first or second embodiment.

FIG. 9 is a partial circuit diagram illustrating part of a VCO in a third modification of the clock recovery circuit according to the first or second embodiment. This shows an offset voltage correction circuit for stably operating a ring oscillator at high speed.

By correcting a shift in offset voltage that becomes a problem in a case where a ring oscillator is operated at high speed, not only a shift in offset voltage but also a shift in duty cycle is corrected. If there is a shift in the offset voltage or duty ratio of a differential input pair 114 and 115 of the clock signal when the ring oscillator is operating at a high frequency, this shift of the differential buffer is amplified and a problem that results is deterioration of the differential output pair of the clock signal.

The offset correction circuit of FIG. 9 is such that a differential signal pair 116 and 117 of the clock signal output from a clock buffer 111 that constitute the ring buffer is supplied to a low-pass filter 112 from which the DC components of the respective signals are extracted. A voltage difference between DC components 118 and 119 thus obtained is amplified by a comparator 113. Comparator outputs 120 and 121 are fed back to the clock buffer 111 as a differential signal pair of an offset voltage correction signal. The clock buffer 111 is made up of a differential buffer having a differential input pair for correcting the DC level. Using the differential input pair 120 and 121 of the offset voltage correction signal, the clock buffer cancels out the offset voltage of the differential input pair 114 and 115 of the clock signal.

Figure 10:
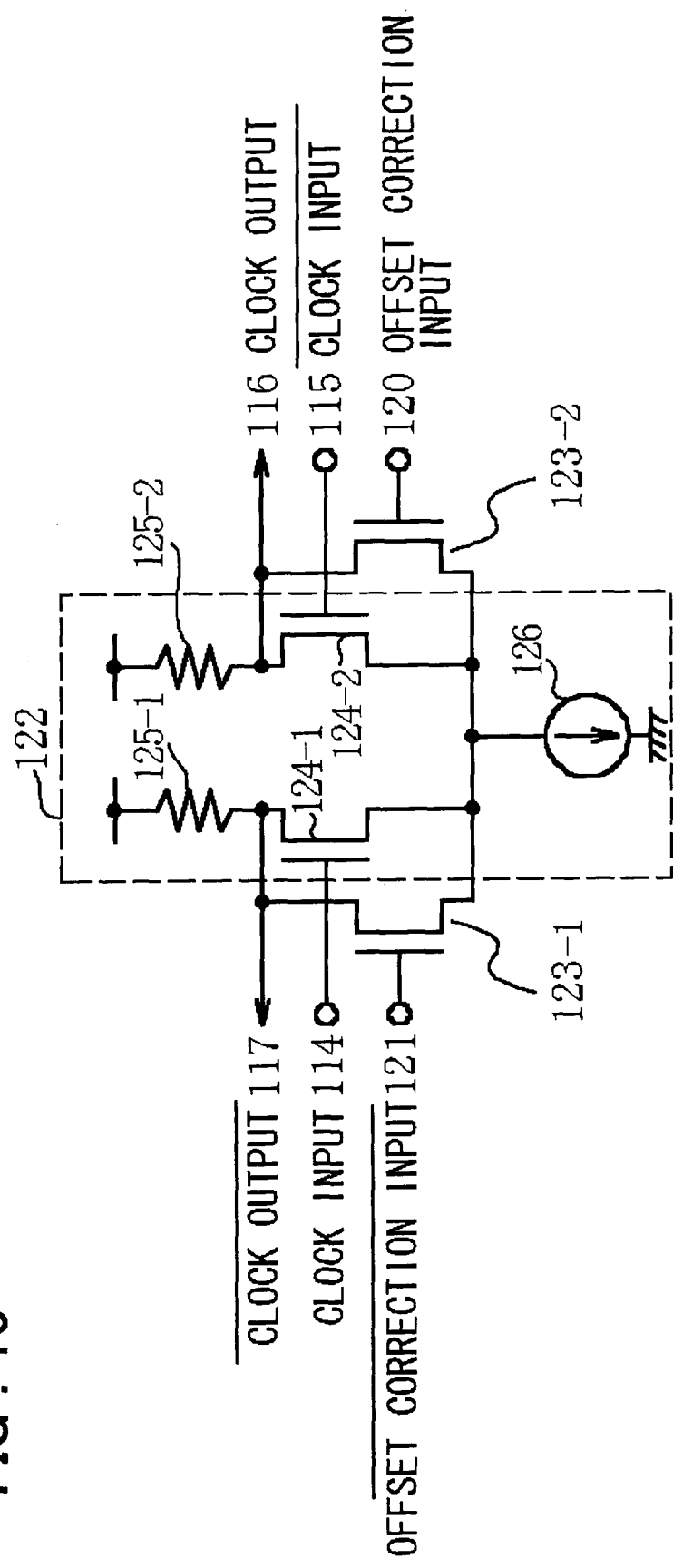
FIG. 10 is a circuit diagram illustrating an example of the structure of a clock buffer in the VCO of the clock recovery circuit of the third modification shown in FIG. 9.

FIG. 10 is a circuit diagram illustrating an example of the structure of the clock buffer 111 used in FIG. 9. The clock buffer 111 is obtained by adding a differential pair 123 onto a conventional differential buffer 122 which includes a differential pair transistors 124-1 and 124-2 having sources connected in common to a current source 126, and drains connected to load circuits 125-1 and 125-2, and gates connected to differential clock input pair 114 and 115.

There are provided transistors 123-1 and 123-2 which have gates connected to /offset correction signal 121 and offset correction signal 120 respectively, have sources connected to the current source 126, and have drains connected to drains of transistors 123-1 and 123-2 respectively.

The differential input pair 114 and 115 of the clock signal and the inverted differential input pair 121 and 120 of the offset correction signal are added internally. In a case where a shift in the offset voltage occurs in the differential input pair 114 and 115 of the clock, a DC voltage that cancels out this shift is internally added to the inverted differential input pair 121 and 122 of the offset correction signal, whereby a clock signal that is devoid of a shift in offset voltage can be output from the differential output pair 114 and 115 of the clock signal.

Figure 11:
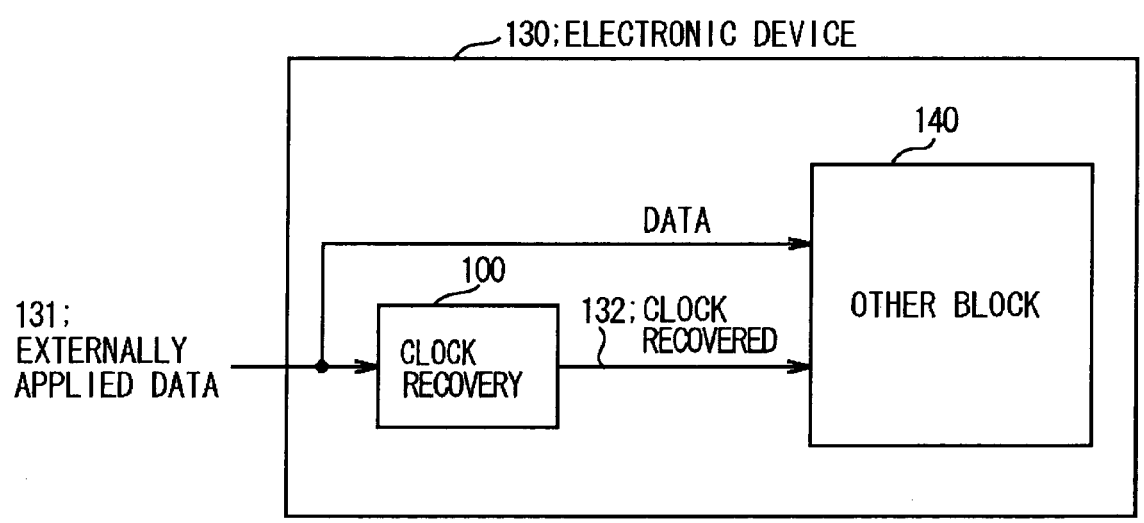
FIG. 11 is a block diagram illustrating an example of an electronic device that employs the clock recovery circuit of the present invention.

FIG. 11 is a block diagram illustrating an example of an electronic device that employs the clock recovery circuit 100 according to the above embodiment of the present invention. The clock recovery circuit 100 receives an externally applied data signal 131 and output a recovered clock signal 132, a phase of which is locked to the received data signal 131. The received data signal 131 and a clock signal 132 output from the clock recovery circuit 100 are supplied to another block 140 which samples and processes received data signal based on the clock signal.

By using the clock recovery circuit in an electronic device 130 such as a computer, communication device or consumer device, it is possible to recover a clock signal synchronized to digital data received from the outside and to supply the recovered clock signal to the other block 140.

The meritorious effects of the present invention are summarized as follows.

As described above, the clock recovery circuit according to the present invention is such that in a timing circuit of a receiver for digital transmission, a clock signal synchronized to the phase of data can be regenerated at the same time the data is received. By using a voltage-controlled oscillator that oscillates at n [Hz], it is possible to receive data having a speed of 2n [bps]. Thus, a higher speed can be achieved in comparison with the conventional arrangement that relies upon a gated voltage-controlled oscillator.

Further, the area of the circuitry can be reduced to a fraction of that of the conventional clock recovery circuit that employs a PLL or clock recovery circuit that requires a multiphase clock signal.

Furthermore, the oscillating circuit and clock buffer can be operated stably at higher frequencies.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock recovery circuit receiving a data signal and recovering a clock signal from the received data signal to output the recovered clock signal, comprising:
    a ring oscillator;
    means for controlling an oscillation frequency of the ring oscillator;
    means for comparing phases between a clock signal output from the ring oscillator and the received data signal to output a phase comparison result as a phase discrimination signal; and
    means for controlling to execute any of inversion and non-inversion of an edge portion of a delayed signal of the received data signal based upon the phase discrimination signal to inject any of the inverted and non-inverted result of the delayed signal, as an edge injection signal, into a loop of the ring oscillator at every edge of the received data signal to cause the clock signal output from the ring oscillator to be locked to the received data signal.

2. The clock recovery circuit according to claim 1, comprising:
    a phase discriminating circuit for discriminating, at every edge of the received data signal, phase lead or phase lag of an identically directed edge of the clock signal, and outputting the phase discrimination signal;
    an edge detecting circuit for detecting an edge of the received data signal, outputting an edge detection signal of a fixed pulse width, said edge detecting circuit delaying the received data signal up to half of the fixed pulse width and outputting the delayed signal;
    an exclusive-OR gate for outputting, as the edge injection signal, an exclusive-OR result of the phase discrimination signal and the delayed signal; and
    a voltage-controlled oscillator for variably controlling the frequency of the ring oscillator by a frequency control voltage, said voltage-controlled oscillator including a circuit for injecting the edge injection signal into the loop of the ring oscillator during a period of the fixed pulse width for synchronizing and outputting the clock signal.

3. The clock recovery circuit according to claim 2, wherein said phase discriminating circuit includes:
    a first D-type flip-flop for sampling the clock signal at a rising-edge of the received data signal;

a second D-type flip flop for sampling an inverted signal of the clock signal at a falling-edge of the received data signal; and a selector for selecting an output of either of the first and second D-type flip-flops in accordance with a logic level of the received data signal and outputting the selected signal as the phase discrimination signal.

4. The clock recovery circuit according to claim 2, wherein said edge detecting circuit includes:

a first delay circuit for delaying a buffered output of the received data signal up to half of the fixed pulse width and outputting the delayed buffered output as the delayed signal;

a second delay circuit for delaying the delayed signal up to half the fixed pulse width; and an exclusive-OR gate, receiving an output signal of the second delay circuit and the buffered output signal as inputs, for performing an exclusive-OR operation between said two inputs to output the edge detection signal.

5. The clock recovery circuit according to claim 2, wherein said voltage- controlled oscillator includes:

a selector, receiving the clock signal from the ring oscillator and the edge injection signal from the exclusive-OR gate as inputs, for selecting and outputting the edge injection signal in conformity with the edge detection signal; and a delay and inverting circuit, receiving the output signal of said selector, for delaying and inverting the output signal to output the clock signal, said delay and inverting circuit including plural stages of delay elements arranged in a cascade connection, the delay thereof being controlled by the frequency control voltage.

6. The clock recovery circuit according to claim 2, wherein said voltage- controlled oscillator includes:

a mixer, receiving the clock signal from the ring oscillator and the edge injection signal from the exclusive-OR gate as input, for mixing the input signals at a fixed ratio in accordance with the edge detection signal and outputting the mixed signal; and a delay and inverting circuit, receiving the output of said mixer as an input, for delaying and inverting the output and outputting the clock signal, said delay and inverting circuit including plural stages of delay elements arranged in a cascade connection, the delay thereof being controlled by the frequency control voltage.

7. The clock recovery circuit according to claim 2, further comprising a current to voltage converting circuit for converting a frequency control current to the frequency control voltage to output the frequency control voltage, wherein the frequency control current is supplied upon being converted to a respective frequency control voltage from an output voltage of a low-pass filter which, together with a second voltage-controlled oscillator having a structure identical with that of said voltage-controlled oscillator, separately constitutes a phase-locked loop.

8. The clock recovery circuit according to claim 2, wherein said edge detecting circuit and said exclusive-OR gate respectively comprise logic gates, each delay of which is adjusted by a delay control voltage, wherein the delay control voltage is a delay control voltage for plural stages of delay elements controlled to have a fixed delay and separately constituting a delay-locked loop or phase-locked loop.

9. The clock recovery circuit according to claim 5, wherein said delay and inverting circuit includes a differential buffer, as the delay element, said differential buffer receiving a differential input signal pair to output a differential output signal pair with current mode logic and performing an offset correction based upon a differential signal pair of an offset correction signal;

a low-pass filter for performing differentially low pass operation with current mode logic, and extracting each DC component of a differential signal pair of the clock signal; and a comparator or amplifier for performing a differential amplification operation with current mode logic, comparing and amplifying a voltage difference between an output pair of DC components of said low-pass filter, and outputting the resulting signals as a differential signal pair of the offset-correction signal.

10. The clock recovery circuit according to claim 9, wherein said differential buffer, which receives the differential signal pair of the clock signal and an inverted differential signal pair of the offset correction signal in parallel, corrects and outputs each shift in the offset voltages in the differential signal pair of the clock signal by internal addition.

11. An electronic device comprising:

the clock recovery circuit set forth in claim 1; and at least one circuit block receiving the clock signal output from the clock recovery circuit.

12. A clock recovery circuit, which receives a data signal and recovers a clock signal locked to the received data signal to output the recovered clock signal, comprising:

a voltage controlled oscillator, an oscillation frequency of which is variably controlled by a frequency control voltage, said voltage controlled oscillator including a plurality of inverters arranged in a loop to constitute a ring oscillator;

a phase discriminating circuit, receiving an output clock signal from the voltage controlled oscillator and the received data signal, for comparing phases between the received data signal and the output clock signal and for outputting the phase discrimination signal indicating whether the phase of the clock signal leads or lags behind the phase of the received data signal;

a delay circuit, receiving the received data signal, for delaying the received data signal to output a delayed signal;

an inversion control circuit, receiving the delayed signal of the received data signal output from said delay circuit and the phase discrimination signal output from said phase discriminating circuit, for controlling to any of invert and non-invert the delayed signal based upon the logic value of the phase discrimination signal, to output the any of the inverted and non-inverted result of the delayed signal as an edge injection signal;

an edge detection circuit, receiving the received data signal, for detecting an edge of the received data signal to output one shot pulse as an edge detection signal; and a selector inserted in a feed back loop of the ring oscillator, said selector receiving the edge injection signal output from the inversion control circuit and the clock signal output from the ring oscillator as inputs and receiving the edge detection signal as a selection control signal, for selecting and injecting said edge of the edge injection signal based on the edge detection signal into the ring oscillator; said edge of the edge injection signal injected into the ring oscillator propagating in the ring oscillator and the clock signal output from the ring oscillator being locked to the received data signal.

13. The clock recovery circuit according to claim 12, wherein the edge detection circuit includes said delay circuit;

a second delay circuit receiving the delayed signal output from said delay circuit for adding delay to the delayed signal and outputting the delay added signal; and a logic circuit receiving the received data signal and the output signal from the second delay circuit to generate a pulse signal, a leading edge of which is specified by the transition edge of the received data signal, and a pulse width of which is a sum of the delay time of said delay circuit and said second delay circuit.

14. The clock recovery circuit according to claim 12, wherein a delay time of said selector is variably controlled by the frequency control voltage supplied to the voltage controlled oscillator.

15. The clock recovery circuit according to claim 12, wherein said phase discriminating circuit includes:
 a first D-type flip-flop sampling the clock signal at a rising-edge of the received data signal;
 a second D-type flip flop sampling an inverted signal of the clock signal at a falling- edge of the received data signal; and
 a selector for selecting an output of either of the first and second D-type flip-flops in accordance with a logic level of the received data signal and outputting the selected signal as the phase discrimination signal.

16. The clock recovery circuit according to claim 12, wherein said selector is replaced by a mixer inserted in the feed back loop of the ring oscillator,
 said mixer, receiving the edge injection signal output from the inversion control circuit and the clock signal output from the ring oscillator as inputs and receiving the edge detection signal as a mixer control signal, for mixing input signals to output an output signal, a phase thereof being controlled to undertake a correction based on the phases of the edge injection signal and the clock signal with a ratio according to the mixer control signal.

17. The clock recovery circuit according to claim 12, wherein there is provided a phase locked loop circuit connected to the clock recovery circuit, said phase locked loop circuit comprising:
 a phase detector for comparing phase of a clock signal with a reference clock signal supplied to said phase locked loop circuit or the received data signal;
 a charge pump and low pass filter for generating and smoothing a capacitor voltage corresponding to the phase comparison result;
 a plurality of voltage to current converting circuits, each receiving the capacitor voltage as a frequency control voltage and converting the voltage to a current;
 a current to voltage converting circuit for receiving the current from one of said voltage to current converting circuits and converting the current to a voltage; and
 a voltage controlled oscillator receiving the voltage from the current to voltage converting circuit as said frequency control voltage for outputting the clock signal fed back to said phase detector; wherein the clock recovery circuit comprises a current to voltage converting circuit for receiving a current from corresponding voltage to current converting circuit for receiving and converting said frequency control voltage to a current provided in said phase locked loop, a frequency control voltage signal output from said current to voltage converting circuit being supplied to said voltage controlled oscillator in the clock recovery circuit.

18. The clock recovery circuit according to claim 17, wherein a transistor constituting the current to voltage converting circuit and a transistor constituting the inverter in the ring oscillator compose a current mirror circuit.

19. The clock recovery circuit according to claim 18, wherein the ring oscillator includes a plurality of inverters arranged in a loop; said inverter comprising:
 a pair of MOS transistors constituting a differential pair; and
 a pair of MOS transistors constituting an active load, wherein gates of said MOS transistors constituting the active load are connected in common to a gate and a drain of a MOS transistor constituting the current to voltage converter, while sources of said MOS transistors composing the active load and the source of said MOS transistor constituting the current to voltage converter are connected in common to a power supply terminal.

20. The clock recovery circuit according to claim 13, wherein there is provided a delay locked loop connected to the clock recovery circuit, said delay locked loop comprising:
 a plurality of delay elements arranged in a cascade connection for delaying a reference clock signal;
 a phase detector for detecting phase difference between the reference clock signal and a delayed reference clock signal; and
 a charge pump circuit for charging/discharging a capacitor according to the phase detection result by the phase detector, the capacitor terminal voltage being supplied to the delay elements as a delay control signal; and wherein
 said delay control signal is supplied to said delay circuit and second delay circuit of the clock recovery circuit and/or said delay control signal is supplied to the an inversion control circuit of the clock recovery circuit to variably control delay time thereof.

21. The clock recovery circuit according to claim 20, wherein said ring oscillator comprises a differential buffer circuit for receiving a deferential input signal pair and for outputting a deferential output signal pair; and wherein
 there is provided an offset correction circuit comprising:
 a low pass filter for receiving the deferential output signal pair from said differential buffer circuit for passing low frequency components including DC component to output a differential output signal pair; and
 a differential amplifier for receiving said differential output signal pair and for differentially amplifying the received differential signal pair to output a deferential output signal pair, which are supplied to said differential buffer circuit as offset correction signals.

22. The clock recovery circuit according to claim 21, wherein said differential buffer circuit comprises:
 a current source;
 a pair of MOS transistors constituting a differential pair, receiving complementary clock signals at gates thereof and having sources connected in common to the current source for supplying a current to the differential pair;
 a pair of transistor constituting an active load; and
 a pair of transistors each connected in parallel with a corresponding transistor of the differential pair, receiving respectively complementary signals of said differential offset correction signal pair at gates thereof.

* * * * *